(12) United States Patent
Treibergs et al.

(10) Patent No.: US 11,041,881 B2
(45) Date of Patent: Jun. 22, 2021

(54) HYBRID PROBE HEAD ASSEMBLY FOR TESTING A WAFER DEVICE UNDER TEST

(71) Applicant: XCERRA CORPORATION, Norwood, MA (US)

(72) Inventors: Valts Treibergs, St. Paul, MN (US); Mitchell Nelson, St. Paul, MN (US)

(73) Assignee: XCERRA CORPORATION, Norwood, MA (US)

(*) Notice: Subject to any disclaimer, the term of this patent is extended or adjusted under 35 U.S.C. 154(b) by 0 days.

(21) Appl. No.: 16/424,198

(22) Filed: May 28, 2019

(65) Prior Publication Data

US 2019/0369142 A1 Dec. 5, 2019

Related U.S. Application Data

(60) Provisional application No. 62/679,488, filed on Jun. 1, 2018.

(51) Int. Cl.
| | | |
|---|---|---|
| *G01R 1/067* | (2006.01) | |
| *G01R 1/073* | (2006.01) | |
| *G01R 31/28* | (2006.01) | |

(52) U.S. Cl.
CPC ..... *G01R 1/06727* (2013.01); *G01R 1/06722* (2013.01); *G01R 1/07307* (2013.01); *G01R 31/2831* (2013.01)

(58) Field of Classification Search
CPC ............ G01R 1/06722; G01R 1/06727; G01R 1/06772; G01R 1/07307; G01R 1/07314;
(Continued)

(56) References Cited

U.S. PATENT DOCUMENTS

| | | |
|---|---|---|
| 4,961,052 A | 10/1990 | Tada et al. |
| 9,329,205 B2 | 5/2016 | Lou et al. |

(Continued)

FOREIGN PATENT DOCUMENTS

| | | |
|---|---|---|
| JP | H06334005 A | 12/1994 |
| JP | 2007218635 A | 8/2007 |
| JP | 2015010980 A | 1/2015 |

OTHER PUBLICATIONS

Jing, X, et al., "Design and fabrication of a micromachined bilayer cantilever probe card", J Micro/Nanolith, MEMS MOEMS 9(4), 043005 (2010).

(Continued)

*Primary Examiner* — Jay Patidar
(74) *Attorney, Agent, or Firm* — Viksnins Harris Padys Malen LLP (57) ABSTRACT

A hybrid probe head assembly for testing a wafer device under test includes a housing, at least a portion of a lead frame assembly disposed in the housing, the lead frame assembly including a at least one cantilever portion, the at least one cantilever portion including an undeflected position and a deflected position, where the lead frame assembly hinges between the undeflected position and the deflected position at a lead frame pivot point, and the at least one cantilever portion extends to a wafer contact. In the undeflected position, the at least one cantilever portion is disposed at a 8-12 degree angle, and in the deflected position, the at least one cantilever portion is disposed at a 2-4 degree angle. One or more spring probes are disposed within the housing and have a wafer contact tip.

19 Claims, 9 Drawing Sheets

(58) Field of Classification Search
CPC ............ G01R 1/07342; G01R 31/2831; G01R 31/2886; G01R 1/06716
See application file for complete search history.

(56) References Cited

U.S. PATENT DOCUMENTS

| | | |
|---|---|---|
| 2001/0019276 A1 | 9/2001 | Yoshida et al. |
| 2008/0174328 A1* | 7/2008 | Miller ................ G01R 1/07342 324/755.03 |
| 2011/0148449 A1* | 6/2011 | Williams ........... G01R 1/06727 324/756.03 |
| 2015/0362551 A1 | 12/2015 | Saunders et al. |
| 2015/0369840 A1 | 12/2015 | Treibergs et al. |
| 2018/0096917 A1 | 4/2018 | Treibergs et al. |

OTHER PUBLICATIONS

Mroczkowski, J , "WLCSP xWave for high frequency wafer probe applications", SWTW; SW Test Workshop, Xcerra Corporation, 14 pages, Jun. 3-6, 2018.
Patent Cooperation Treaty , International Searching Authority, Search Report and Written Opinion for PCT/US2019034204, 15 pages, dated Aug. 20, 2019.

* cited by examiner

FIG. 17

HYBRID PROBE HEAD ASSEMBLY FOR TESTING A WAFER DEVICE UNDER TEST

RELATED APPLICATION

This application claims priority to U.S. Provisional Application No. 62/679,488 that was filed on Jun. 1, 2018. The entire content of the application referenced above is hereby incorporated by reference herein.

TECHNICAL FIELD

Hybrid probe head assembly for testing a wafer device under test.

TECHNICAL BACKGROUND

Post production testing of semiconductor devices allows manufacturers to economically diagnose manufacturing problems. The ability to accurately and rapidly test devices improves productivity of the manufacturing process. As the complexity of wafers increases, the difficulty in accurately testing the wafers increases. What is needed is a wafer testing probe that can accurately and efficiently test a wafer device under test (DUT).

SUMMARY

A hybrid probe head assembly for testing a wafer device under test includes a housing, at least a portion of a lead frame assembly disposed in the housing, the lead frame assembly including a at least one cantilever portion, the at least one cantilever portion including an undeflected position and a deflected position, where the lead frame assembly hinges between the undeflected position and the deflected position at a lead frame pivot point, and the at least one cantilever portion extends to a wafer contact. In the undeflected position, the at least one cantilever portion is disposed at a 8-12 degree angle, and in the deflected position, the at least one cantilever portion is disposed at a 2-4 degree angle. One or more spring probes are disposed within the housing and have a wafer contact tip.

In one or more embodiments, the hybrid probe head assembly further includes when the at least one cantilever portion moves from the first undeflected position to the second deflected, the wafer contact slides relative to a testing contact of the wafer DUT.

In one or more embodiments, the lead frame assembly is an impedance controlled lead frame assembly.

In one or more embodiments, in the undeflected position, the at least one cantilever portion is disposed at about a 10 degree angle relative to the horizontal frame.

In one or more embodiments, in the deflected position, the at least one cantilever portion is disposed at a 2-3 degree angle relative to the horizontal frame.

In one or more embodiments, the housing includes a ledge at which the at least one cantilever portion hinges relative to the horizontal frame.

In one or more embodiments, the wafer contact tip of the one or more spring probes is disposed at a substantially same height as the wafer contact of the lead frame assembly.

In one or more embodiments, a reaction force between the wafer DUT and the one or more spring probes and between the wafer DUT and the at least one cantilever portion are substantially the same.

In one or more embodiments, the lead frame assembly includes a platform portion.

In one or more embodiments, the wafer contact is at least one of a cup or slot.

In one or more embodiments, a hybrid probe head assembly for testing a wafer device under test (wafer DUT) includes a housing, and at least one lead frame assembly disposed in the housing, at least a portion of the lead frame assembly disposed on a substrate, where the lead frame assembly including a platform portion and at least one cantilever portion. The cantilever portion includes an undeflected position and a deflected position, and the at least one cantilever portion extending to a wafer contact. The lead frame assembly has a lead frame pivot between the platform portion and the at least one cantilever portion. In the undeflected position, the at least one cantilever portion is disposed at a 8-12 degree angle relative to the platform portion. In the deflected position, the at least one cantilever portion is disposed at a 2-4 degree angle relative to the platform portion. The assembly further includes at least one printed circuit board (PCB) disposed adjacent to the housing, and one or more spring probes disposed within the housing. The spring probes have a spring probe undeflected position and a spring probe deflected position, the one or more spring probes have a wafer contact tip, the one or more spring probes coupled with the at least one PCB.

In one or more embodiments, the hybrid probe head assembly further includes when the at least one cantilever portion moves from the first undeflected position to the second deflected, the wafer contact slides relative to a testing contact of the wafer DUT.

In one or more embodiments, the lead frame assembly is an impedance controlled lead frame assembly.

In one or more embodiments, in the undeflected position, the at least one cantilever portion is disposed at about a 10 degree angle relative to the platform portion.

In one or more embodiments, in the deflected position, the at least one cantilever portion is disposed at a 2-3 degree angle relative to the platform portion.

In one or more embodiments, the housing includes a ledge at which the at least one cantilever portion hinges relative to the platform portion.

In one or more embodiments, the wafer contact tip is disposed at a substantially same height as the wafer contact.

In one or more embodiments, a reaction force between the wafer DUT and the one or more spring probes and between the wafer DUT and the at least one cantilever portion are substantially the same.

In one or more embodiments, the wafer contact is at least one of a cup or slot.

These and other embodiments, aspects, advantages, and features of the present invention will be set forth in part in the description which follows, and will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims and their equivalents.

DETAILED DESCRIPTION

The following detailed description includes references to the accompanying drawings, which form a part of the detailed description. The drawings show, by way of illustration, specific embodiments in which the apparatus may be practiced. These embodiments, which are also referred to herein as "examples" or "options," are described in enough detail to enable those skilled in the art to practice the present embodiments. The embodiments may be combined, other embodiments may be utilized or structural or logical changes may be made without departing from the scope of the invention. The following detailed description is, therefore, not to be taken in a limiting sense and the scope of the invention is defined by the appended claims and their legal equivalents.

In this document, the terms "a" or "an" are used to include one or more than one, and the term "or" is used to refer to a nonexclusive "or" unless otherwise indicated. In addition, it is to be understood that the phraseology or terminology employed herein, and not otherwise defined, is for the purpose of description only and not of limitation.

A hybrid probe head assembly for testing high and low speed signals for a wafer device under test (DUT). The probe head assembly can be used for a variety of wafer tests including, but not limited to, WLCSP, bumped die wafer, or true wafer pads. Wafer testing differs from singulated package testing in that semiconductor die are embedded within an outline of a silicon wafer in a matrix, or within a WLCSP redistributed wafer. The wafers are handled in X-Y-Z motions on a semiconductor prober all at once. A probe card engages with a wafer by the Z motion of the prober over any programmed individual DUT or combination of DUTs. The hybrid probe head assembly is hybrid in that the lead frame assembly handles high speed signals, and spring probe interconnects handle low speed signals, grounds, and power connection to the wafer DUT.

Figure 1:
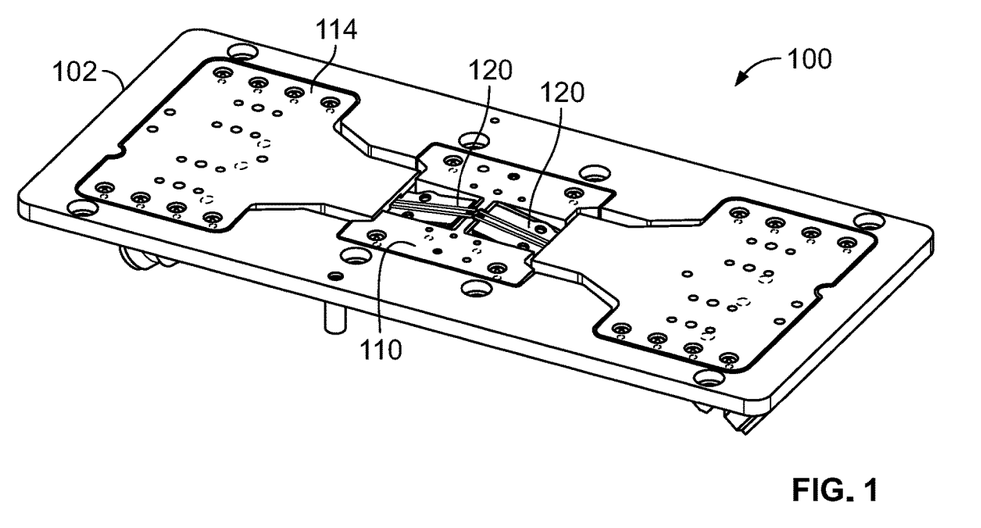
FIG. 1 illustrates a perspective view of a hybrid probe head assembly as constructed in one or more embodiments.
Figure 2:
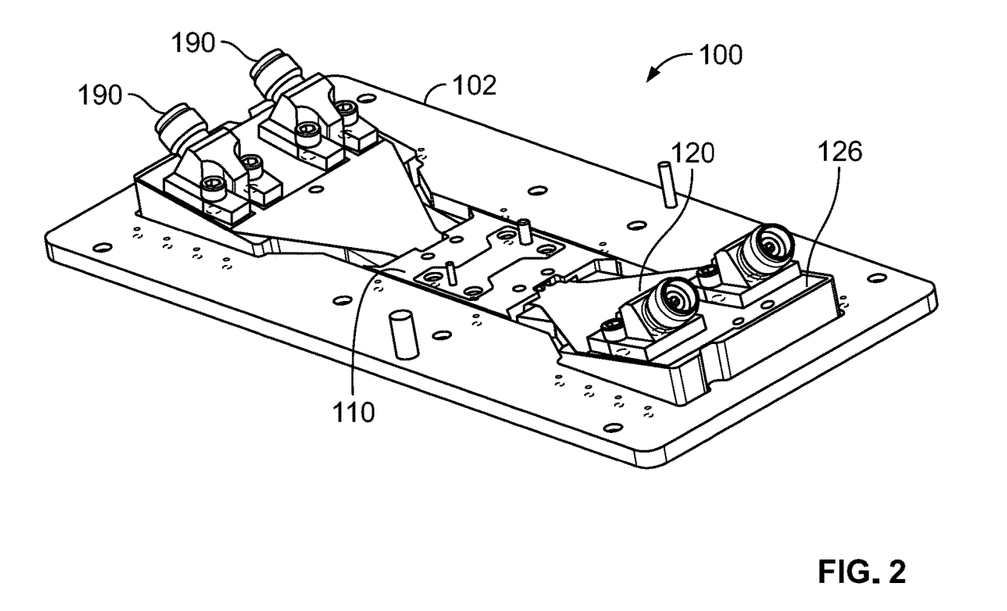
FIG. 2 illustrates a perspective view of a hybrid probe head assembly as constructed in one or more embodiments.
Figure 3:
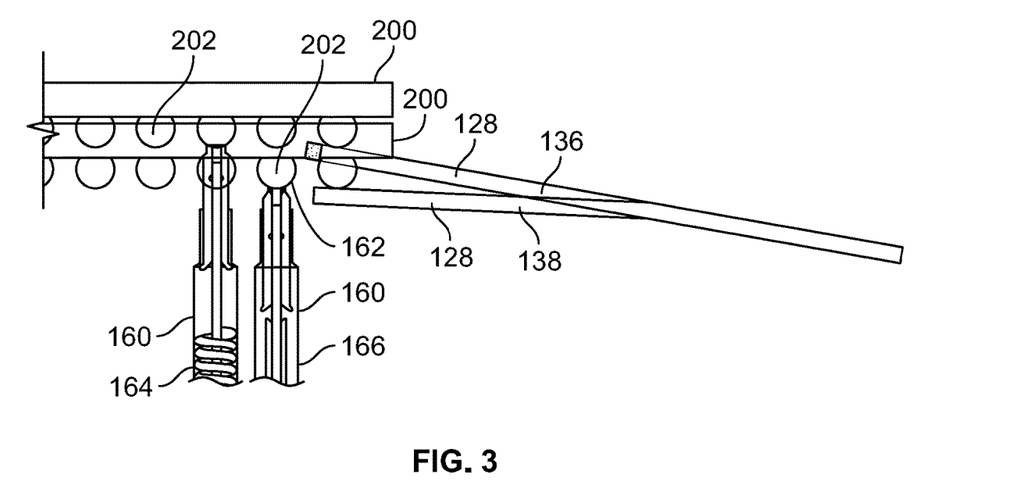
FIG. 3 illustrates a side view of a portion of a hybrid probe head assembly as constructed in one or more embodiments.
Figure 4:
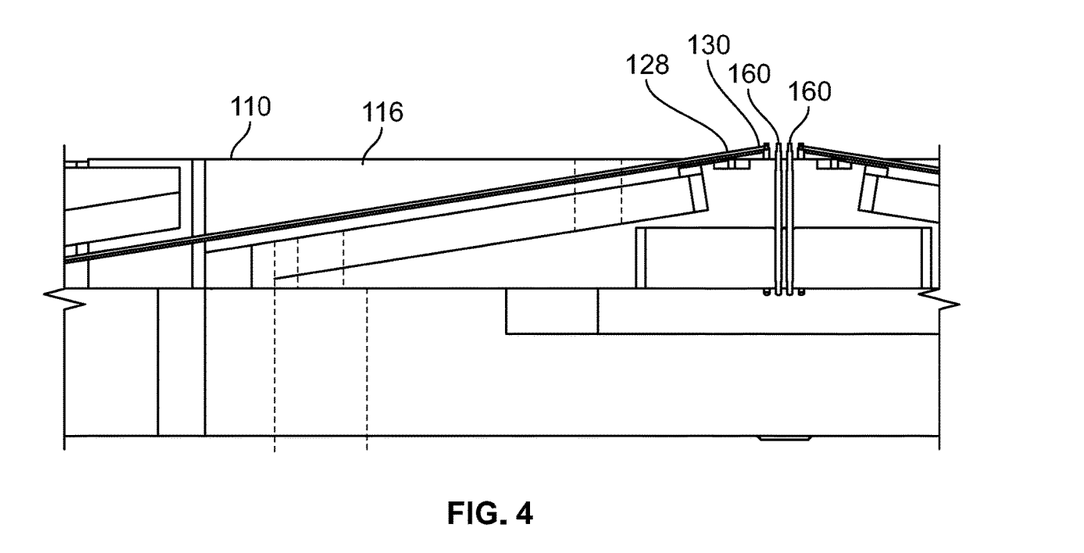
FIG. 4 illustrates a cross-sectional view of a hybrid probe head assembly as constructed in one or more embodiments.

Referring to FIGS. 1-3, the hybrid probe head assembly 100 includes a housing 110, a lead frame assembly 120, one or more spring probes 160, a printed circuit board (PCB) 180, and co-axial connectors 190.

FIGS. 1-3 illustrate a hybrid probe head assembly 100, including a holding frame 102, and lead frame holder 114, a lead frame assembly 120, one or more spring probes 160, and a housing 110.

The hybrid probe head assembly 100 is used with a device under test 200 (FIG. 2). The spring probes 160 are used for the power, ground and low speed signal connections, such as balls. The lead frame assembly 120 is used for the high speed signals from the DUT 200.

Figure 9:
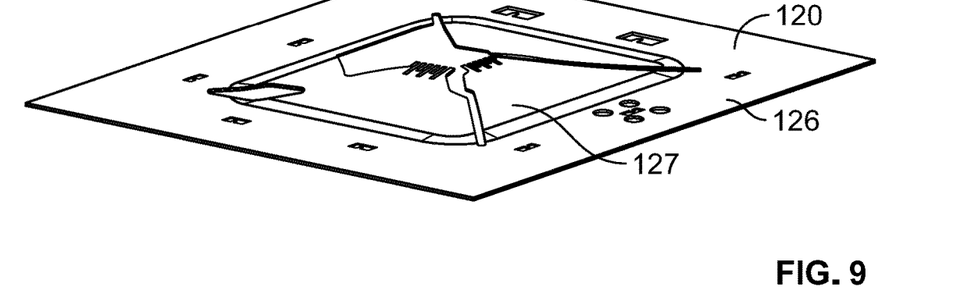
FIG. 9 illustrates a perspective view of a lead frame assembly as constructed in one or more embodiments.
Figure 10:
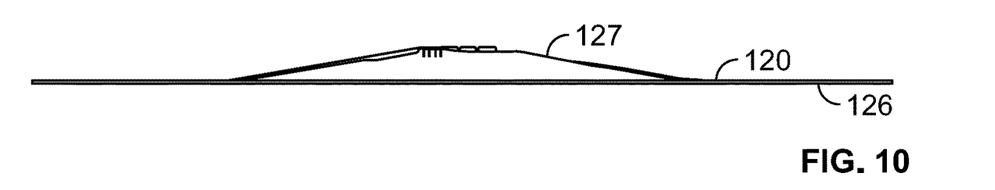
FIG. 10 illustrates a side view of a lead frame assembly as constructed in one or more embodiments.
Figure 15:
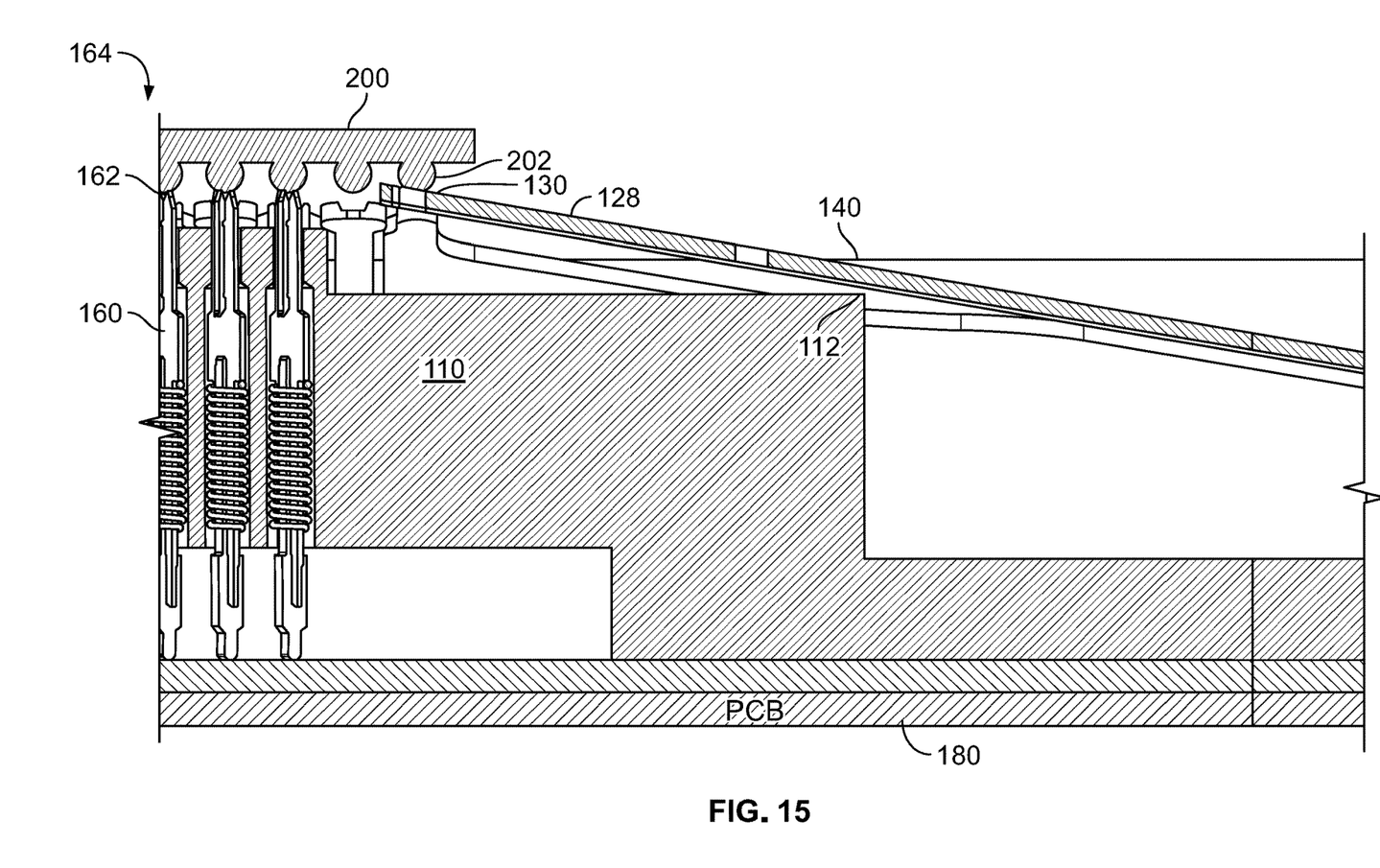
FIG. 15 illustrates a cross-sectional view of a portion of a hybrid probe head assembly as constructed in one or more embodiments.
Figure 16:
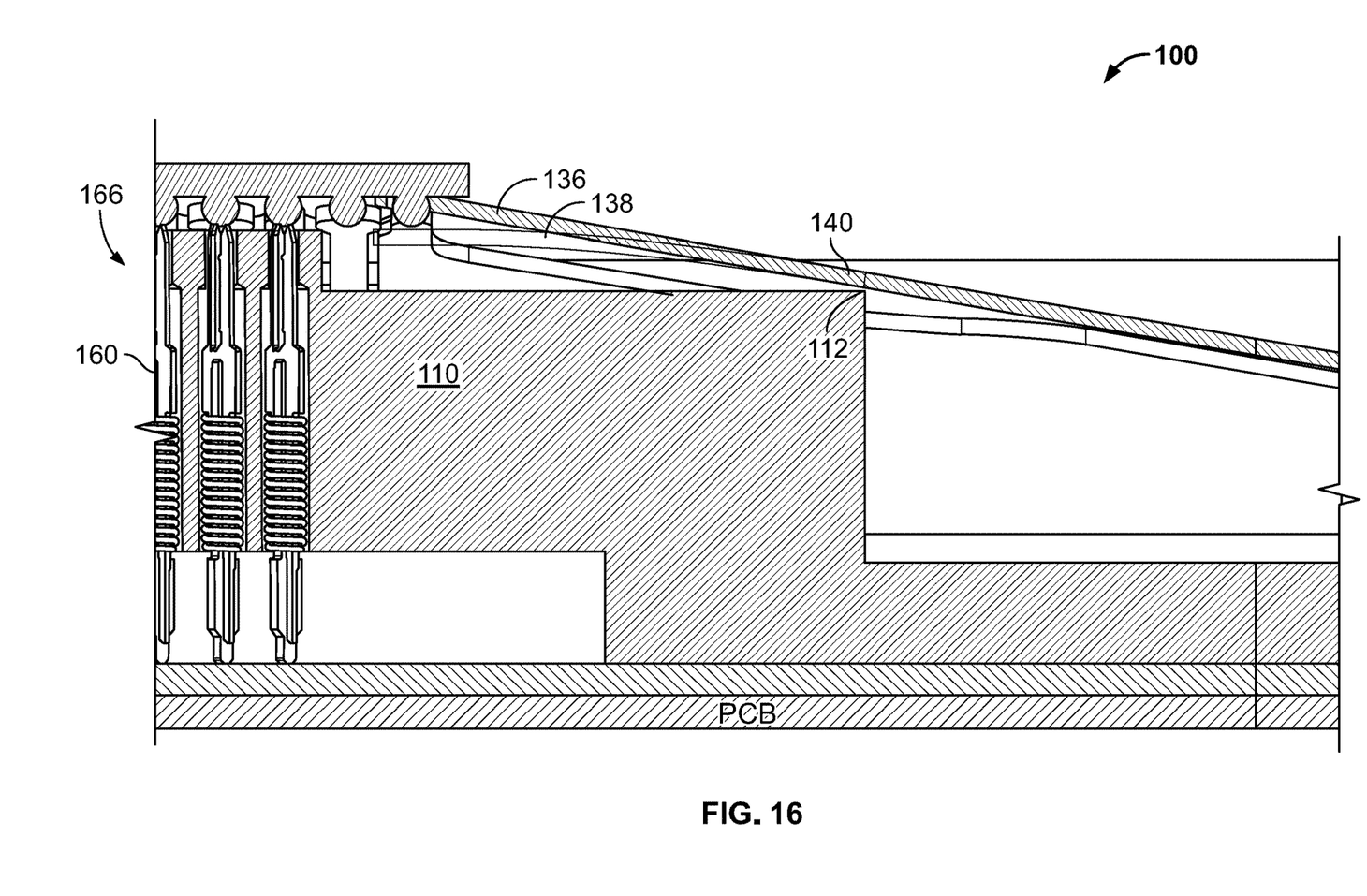
FIG. 16 illustrates a cross-sectional view of a portion of a hybrid probe head assembly as constructed in one or more embodiments.
Figure 17:
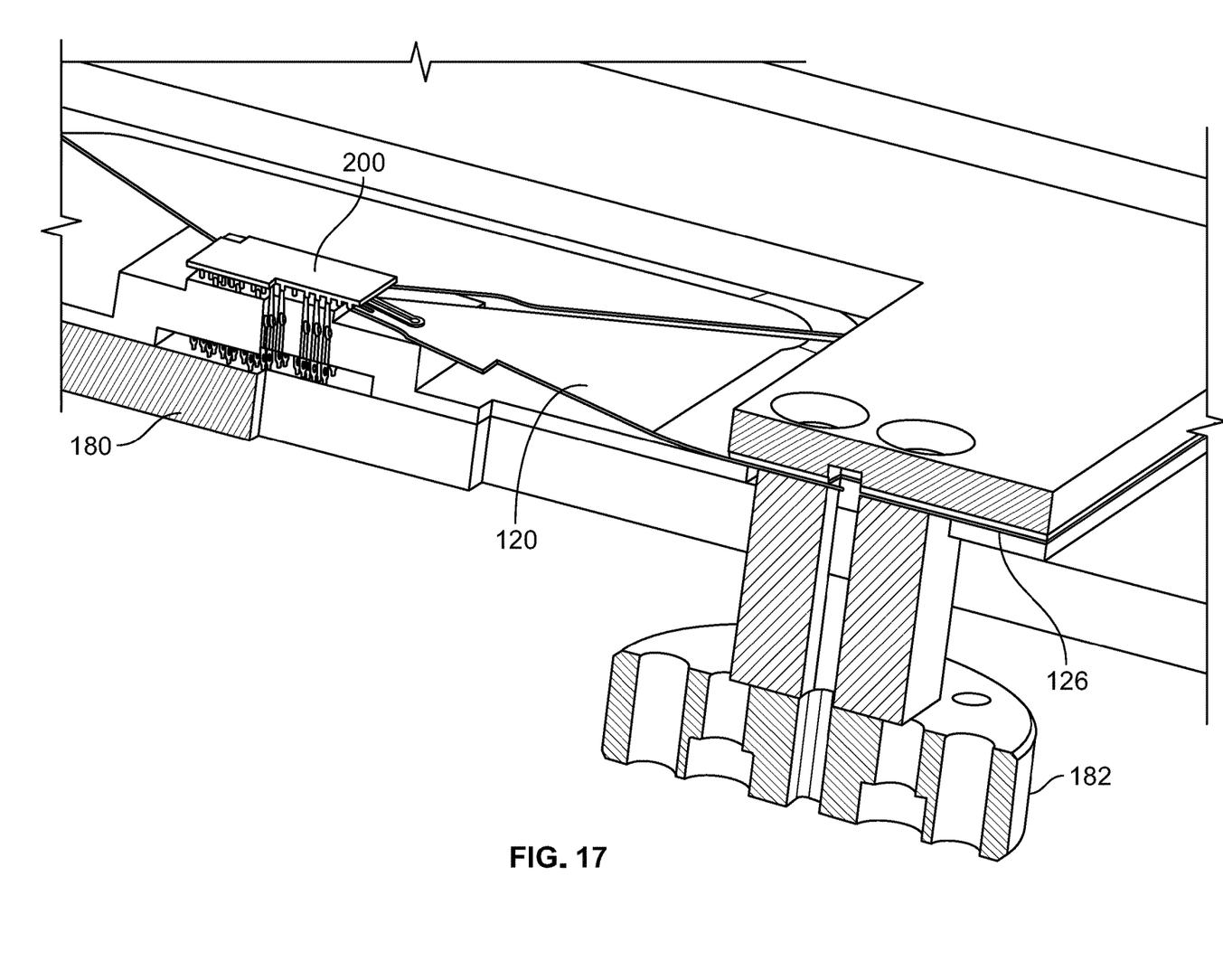
FIG. 17 illustrates a cross-sectional perspective view of a portion of a hybrid probe head assembly as constructed in one or more embodiments.

FIGS. 1, 5, 6, 9-17 show the lead frame assembly 120 in greater detail. Generally, the one or more lead frame assemblies 120 engage the wafer DUT testing contact 202, such as DUT balls. The lead frame assemblies 120 are arranged in microwave structures, such as co-planar waveguide (CPW), and use a non-conductive flexible substrate material to keep the signal leads mechanically attached and aligned to ground planes. The lead frame assemblies are arranged to be at an angle with respect to a horizontal plane, for example of a housing of a probe assembly 100, which is disposed parallel to a plane of the wafer DUT 200. In one or more embodiments, the lead frame assembly 120 is flat, and is held at an angle with the lead frame holder 114. In another embodiment, the one or more lead frame assemblies 120 have a bend between a platform portion 126 and a cantilever base 127. For example, an outer portion of the lead frame assembly 120 is parallel to the DUT and the PCB, and an inner portion is bent up to about 10 degree incline, as shown in FIGS. 9-10. The housing can be used to clamp the outer portion of the lead frame assembly 120 and form the bent inner portion, and form a backshort plate. This allows the addition of waveguide launches to the leadframe that extend through the bottom of the probecard PCB. In an option, the lead frame assembly 120 is terminated in waveguide antennas, so that the hybrid probe head assembly 100 can be connected directly with a waveguide. In one or more embodiments, the assembly includes a waveguide 182 and flange, as shown in FIG. 17.

The lead frame assembly 120 includes an electrically conductive sheet with holes, slots, and cantilever portion 128 that make the impedance controlled microwave structures (such as a coplanar waveguide). Microwave structures are formed to high speed signal positions of the device under test, and are routed to the edge of the lead frame assembly 120 or to an interior position in the grounding portion of the lead frame. Other holes can be fabricated in the ground plane and can be used for mechanical fastening and/or alignment.

Figure 11A:
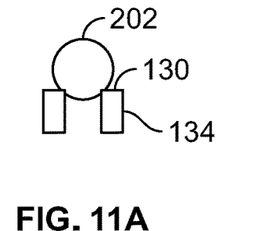
FIG. 11A illustrates a side view of a wafer contact as constructed in one or more embodiments.
Figure 11B:
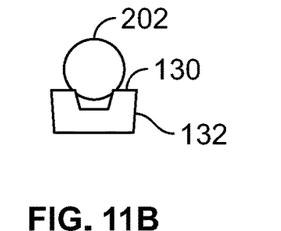
FIG. 11B illustrates a side view of a wafer contact as constructed in one or more embodiments.
Figure 11C:
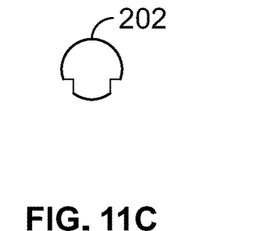
FIG. 11C illustrates a side view of contact marks on a testing contact of a DUT as constructed in one or more embodiments.
Figure 12:
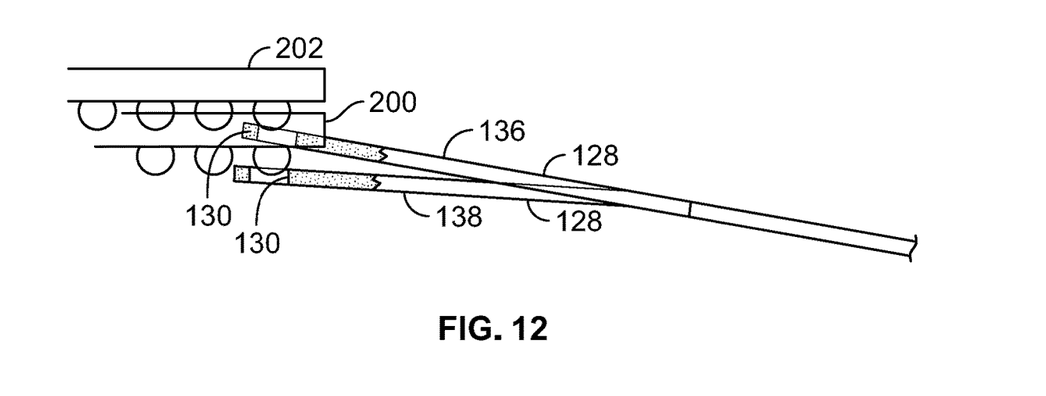
FIG. 12 illustrates a side view of a cantilever portion and a DUT as constructed in one or more embodiments, shown in the undeflected and deflected position.
Figure 13:
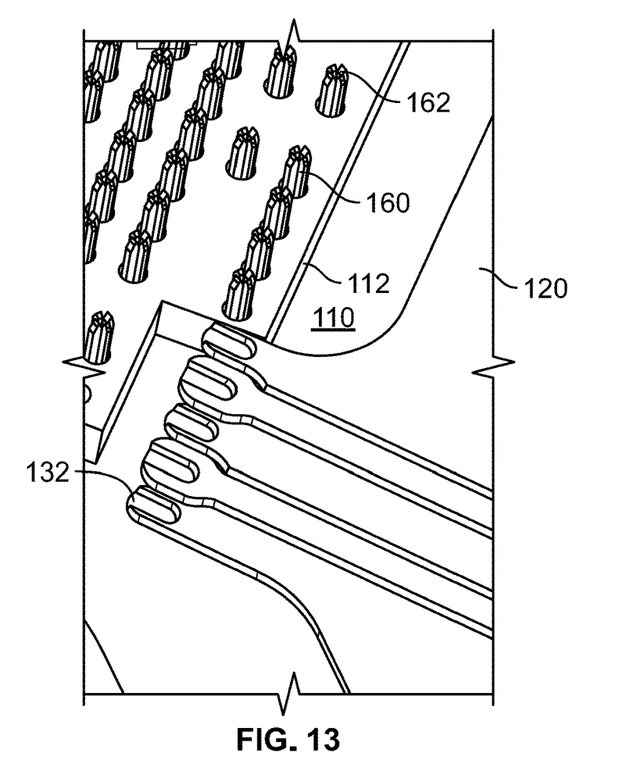
FIG. 13 illustrates a perspective view of a portion of a hybrid probe head assembly as constructed in one or more embodiments.
Figure 14:
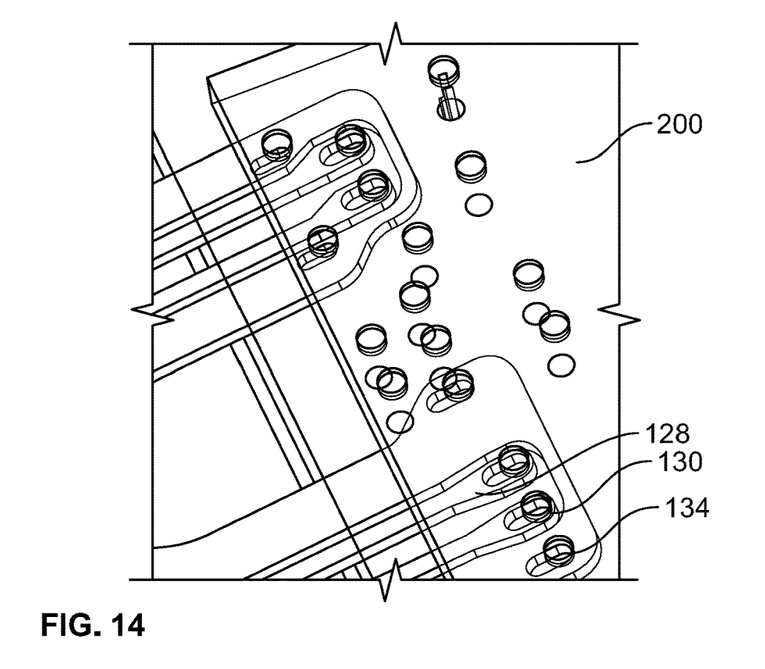
FIG. 14 illustrates a perspective view of a portion of a hybrid probe head assembly as constructed in one or more embodiments.

At least a portion of a lead frame assembly 120 is disposed in the housing 110, where the housing 110, in at least one embodiment, includes a ledge 112. The lead frame assembly includes and at least one cantilever portion 128, where the at least one cantilever portion 128 is movable from an undeflected position 136 to a deflected position 138, where the lead frame assembly hinges between the undeflected position and the deflected position at a lead frame pivot point 140. The at least one cantilever portion 128, which can include one or more members, extends to a wafer contact 130. The wafer contact 130 can include a cup 132 or slot 134, as shown in FIGS. 11A and 11B. The wafer contact 130 is configured to slide relative to the testing contact and across the testing contact 202 as the at least one cantilever portion 128 is deflected, causing a scrubbing action to remove a portion of the outer material on two sides of the ball, as shown in FIG. 11C, ensuring good electrical contact with the wafer DUT. For example, at first touch (undeflected) the ball of the wafer DUT is in front of the slot or cup. As the cantilever portion bends to the deflected position, the ball slides to the rear of the slot.

In the undeflected position 136, the at least one cantilever portion 128 is disposed at a 8-12 degree angle relative to the horizontal plane 116 or the platform portion 126. In one or more embodiments, in the undeflected position 136, the at least one cantilever portion 128 is disposed at a 10 degree angle relative to the horizontal plane 116 or the platform portion 126. In the deflected position 138, the at least one cantilever portion 128 is disposed at a 3-4 degree angle relative to the platform portion 126 or horizontal plane 116. In one or more embodiments, in the deflected position 138, the at least one cantilever portion 128 is disposed at a 2-3 degree angle relative to the platform portion 126 or horizontal plane 116.

Figure 5:
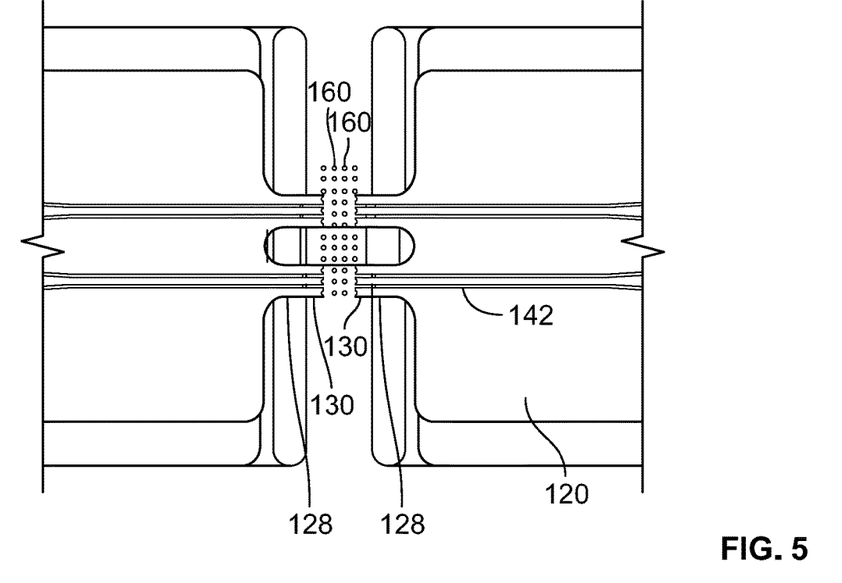
FIG. 5 illustrates a top view of a lead frame assembly as constructed in one or more embodiments.
Figure 6:
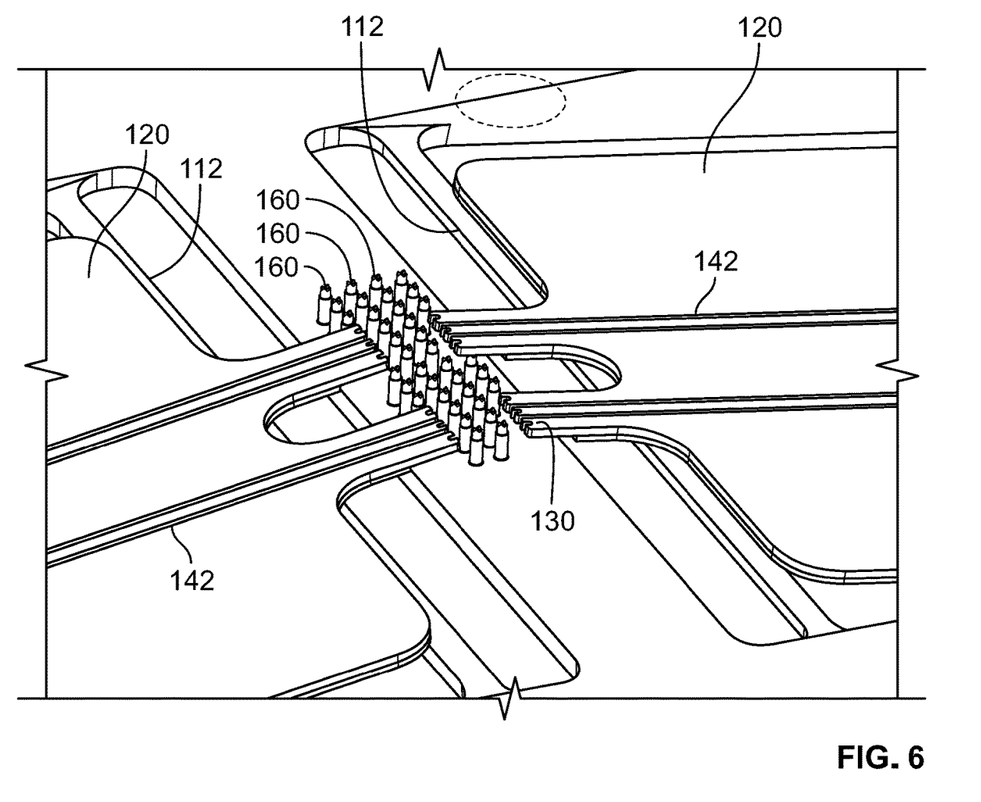
FIG. 6 illustrates a perspective view of a lead frame assembly as constructed in one or more embodiments.
Figure 7:
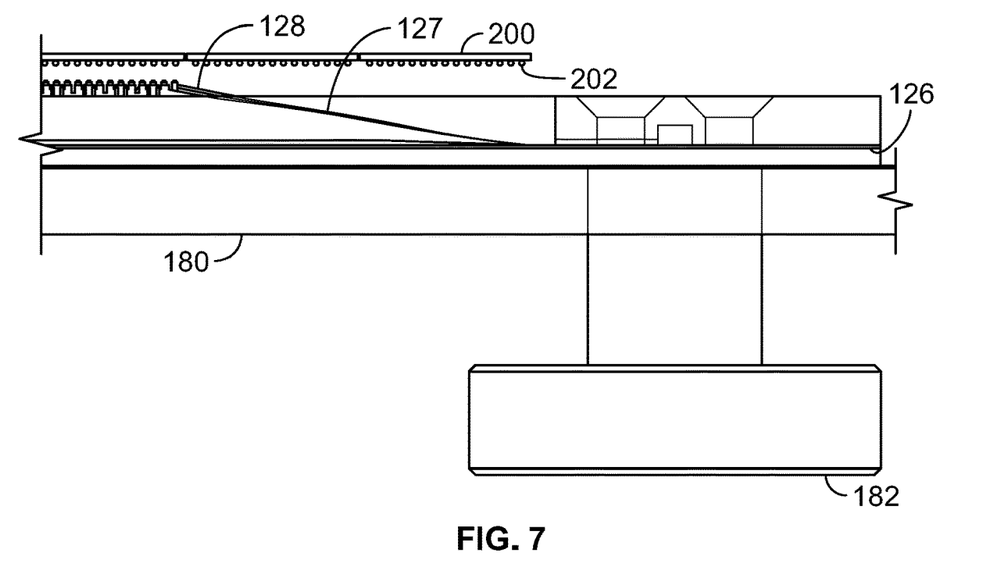
FIG. 7 illustrates a side cross-sectional view of a portion of a hybrid probe head assembly and DUT as constructed in one or more embodiments.
Figure 8:
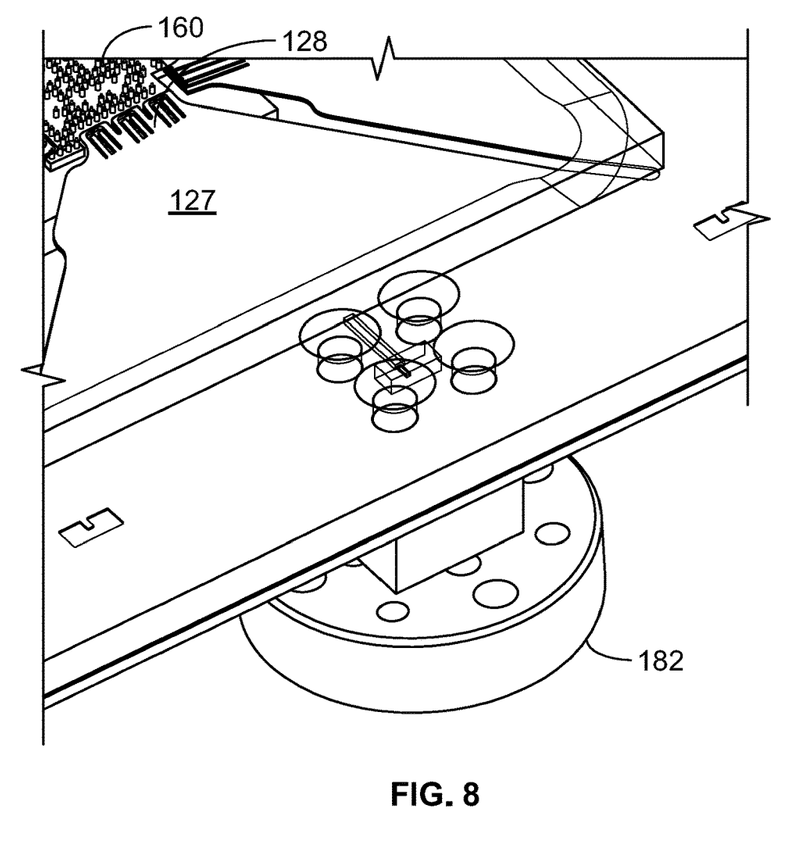
FIG. 8 illustrates a top perspective view of a portion of a hybrid probe head assembly as constructed in one or more embodiments.

The members of the cantilever portion 128 flex relative to the remaining portion of the assembly 120. The cantilever portion 128 include members which interface with the device under test 200 (FIG. 2). In one or more embodiments, the cantilever portion 128 includes CPW structures 142, as shown in FIGS. 5 and 6.

In one or more embodiments, the lead frame microwave structures are terminated externally to precision microwave coaxial connectors. In one or more embodiments, the lead frame is impedance matched at the transition to the coaxial connectors 190 for optimal RF performance. The lead frame can include a flat configuration with axially terminating connectors. Several options for the signal lines are as follows. For instance, in one or more embodiments, the lead frame signal lines are configured in a coplanar waveguide transmission line structure. In one or more embodiments, the lead frame signal lines can be split with a balun structure, so that the split signals shift phase to a prescribed amount at a prescribed frequency. This allows for construction of a balanced differential signal pair. In one or more embodiments, the lead frame signal lines can incorporate loopback structures that are short and connect an input and output signal of a device under test for testing. In addition, in one or more embodiments, lead frame signal lines can be lengthened or shortened to add a prescribed signal delay. The lead frame can further include couplers and/or splitters.

In one or more embodiments, the lead frame microwave structures are terminated externally to precision microwave coaxial connectors. In one or more embodiments, the lead frame is impedance matched at the transition to the coaxial connectors 190 for optimal RF performance. The coaxial connectors 190 can be surface mounted to the lead frame assembly. In one or more embodiments, the outside perimeter of the lead assembly includes the ground plane, however it is not necessary to interface every pin with the ground plane.

The hybrid probe head assembly 100 further includes one or more spring probes 160 disposed in the housing 110, and are coupled with the PCB 180, as shown in FIGS. 15-17. The spring probes 160 carry signals between the PCB 180 and the wafer DUT 200, such as low speed signals, power, and ground. The one or more spring probes 160 have a spring probe undeflected position 164 (FIGS. 3, 15) and a spring probe deflected position 166 (FIGS. 3, 16). The one or more spring probes 160 extend to a wafer contact tip 162. In one or more embodiments, the height of the wafer contact tip 162 is the same or substantially the same as the height of the wafer contact of the at least one cantilever portion 128 in the deflected and/or undeflected position. In one or more embodiments, a reaction force between the wafer DUT and the one or more spring probes and between the wafer DUT and the at least one cantilever portion are substantially the same.

During use of the socket assembly, a method for testing components includes contacting the wafer contact 130 of the lead frame assembly 120 with the testing contact 202 of the wafer DUT 200. In addition, the wafer contact tip 162 of the one or more spring probes 160 contact the testing contacts 202 of the wafer DUT 200. The probes 160 plunge a set distance, drive the spring probe to a certain overdrive distance, and at the same time bending the cantilever portion 128 of the lead frame assembly 120. Reaction force from both the cantilever portion and the probe ensure reliable electrical contact. The force for both (e.g. 5 g) are targeted to match.

It is to be understood that the above description is intended to be illustrative, and not restrictive. Many other embodiments will be apparent to those of skill in the art upon reading and understanding the above description. It should be noted that embodiments discussed in different portions of the description or referred to in different drawings can be combined to form additional embodiments of the present application. The scope should, therefore, be determined with reference to the appended claims, along with the full scope of equivalents to which such claims are entitled.

The invention claimed is:

1. A hybrid probe head assembly for testing a wafer device under test (DUT), the hybrid probe head assembly comprising:
   a housing defined in part by a generally horizontal frame;
   at least a portion of a lead frame assembly disposed in the housing, the lead frame assembly including at least one cantilever portion, the at least one cantilever portion including an undeflected position and a deflected position, where the lead frame assembly hinges between the undeflected position and the deflected position at a lead frame pivot point, the at least one cantilever portion extending to a wafer contact;
   in the undeflected position, the at least one cantilever portion is disposed at a 8-12 degree angle relative to the generally horizontal frame;
   in the deflected position, the at least one cantilever portion is disposed at a 2-4 degree angle relative to the generally horizontal frame; and
   one or more spring probes disposed within the housing, the spring probes have a spring probe undeflected position and a spring probe deflected position, the one or more spring probes have a wafer contact tip.

2. The hybrid probe head assembly as recited in claim 1, further comprising, when the at least one cantilever portion moves from the undeflected position to the deflected position, the wafer contact slides relative to a testing contact of the wafer DUT.

3. The hybrid probe head assembly as recited in claim 1, wherein the lead frame assembly is an impedance controlled lead frame assembly.

4. The hybrid probe head assembly as recited in claim 1, wherein in the undeflected position, the at least one cantilever portion is disposed at about a 10 degree angle relative to the horizontal frame.

5. The hybrid probe head assembly as recited in claim 1, wherein in the deflected position, the at least one cantilever portion is disposed at a 3-4 degree angle relative to the horizontal frame.

6. The hybrid probe head assembly as recited in claim 1, wherein the housing includes a ledge at which the at least one cantilever portion hinges relative to the horizontal frame.

7. The hybrid probe head assembly as recited in claim 1, wherein the wafer contact of the lead frame assembly is disposed at a substantially same height as the wafer contact tip of the one or more spring probes.

8. The hybrid probe head assembly as recited in claim 1, wherein a reaction force between the wafer DUT and the one or more spring probes and between the wafer DUT and the at least one cantilever portion are substantially the same.

9. The hybrid probe head assembly as recited in claim 1, wherein the lead frame assembly includes a platform portion.

10. The hybrid probe head assembly as recited in claim 1, wherein the wafer contact is at least one of a cup or slot.

11. A hybrid probe head assembly for testing a wafer device under test (DUT):
a housing;
at least a portion of a lead frame assembly disposed in the housing, the lead frame assembly including a platform portion and at least one cantilever portion, the cantilever portion including an undeflected position and a deflected position, the at least one cantilever portion extending to a wafer contact;
the lead frame assembly having a lead frame pivot between the platform portion and the at least one cantilever portion;
in the undeflected position, the at least one cantilever portion is disposed at a 8-12 degree angle relative to the platform portion;
in the deflected position, the at least one cantilever portion is disposed at a 2-4 degree angle relative to the platform portion;
at least one printed circuit board (PCB) disposed adjacent to the housing; and
one or more spring probes disposed within the housing, the spring probes have a spring probe undeflected position and a spring probe deflected position, the one or more spring probes have a wafer contact tip, the one or more spring probes coupled with the at least one PCB.

12. The hybrid probe head assembly as recited in claim 11, further comprising, when the at least one cantilever portion moves from the undeflected position to the deflected-position, the wafer contact slides relative to a testing contact of the wafer DUT.

13. The hybrid probe head assembly as recited in claim 11, wherein the lead frame assembly is an impedance controlled lead frame assembly.

14. The hybrid probe head assembly as recited in claim 11, wherein in the undeflected position, the at least one cantilever portion is disposed at about a 10 degree angle relative to the platform portion.

15. The hybrid probe head assembly as recited in claim 11, wherein in the deflected position, the at least one cantilever portion is disposed at a 2-3 degree angle relative to the platform portion.

16. The hybrid probe head assembly as recited in claim 11, wherein the housing includes a ledge at which the at least one cantilever portion hinges relative to the platform portion.

17. The hybrid probe head assembly as recited in claim 11, wherein the wafer contact of the lead frame assembly is disposed at a substantially same height as the wafer contact tip of the one or more spring probes.

18. The hybrid probe head assembly as recited in claim 11, wherein a reaction force between the wafer DUT and the one or more spring probes and between the wafer DUT and the at least one cantilever portion are substantially the same.

19. The hybrid probe head assembly as recited in claim 11, wherein the wafer contact is at least one of a cup or slot.

* * * * *